(12) United States Patent  
Toyoda et al.

(10) Patent No.: US 8,041,104 B2  
(45) Date of Patent: Oct. 18, 2011

(54) PATTERN MATCHING APPARATUS AND SCANNING ELECTRON MICROSCOPE USING THE SAME

(75) Inventors: Yasutaka Toyoda, Hitachi (JP); Mitsuji Ikeda, Hitachinaka (JP); Atsushi Takane, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 1334 days.

(21) Appl. No.: 11/207,936

(22) Filed: Aug. 22, 2005

(65) Prior Publication Data

US 2006/0045326 A1    Mar. 2, 2006

(30) Foreign Application Priority Data

Aug. 25, 2004    (JP) ................................ 2004-244555

(51) Int. Cl.  
*G06K 9/00*    (2006.01)

(52) U.S. Cl. ......................... 382/145; 382/144; 382/151

(58) Field of Classification Search .................. 382/145, 382/144, 141  
See application file for complete search history.

(56) References Cited

U.S. PATENT DOCUMENTS

| | | | | | |
|---|---|---|---|---|---|
| 5,046,109 | A | * | 9/1991 | Fujimori et al. | 382/144 |
| 5,150,423 | A | * | 9/1992 | Hoki | 382/145 |
| 5,253,306 | A | * | 10/1993 | Nishio | 382/112 |
| 5,706,216 | A | * | 1/1998 | Reisch | 708/203 |
| 5,825,912 | A | * | 10/1998 | Okubo et al. | 382/145 |
| 5,872,862 | A | * | 2/1999 | Okubo et al. | 382/151 |
| 5,930,007 | A | * | 7/1999 | Kojima | 358/464 |
| 6,044,204 | A | * | 3/2000 | Takamatsu et al. | 358/1.9 |
| 6,075,902 | A | * | 6/2000 | Kojima | 382/260 |
| 6,233,060 | B1 | * | 5/2001 | Shu et al. | 358/1.9 |
| 6,359,703 | B1 | * | 3/2002 | Yabe | 358/1.9 |
| 6,868,175 | B1 | * | 3/2005 | Yamamoto et al. | 382/145 |
| 7,561,188 | B2 | * | 7/2009 | Kondo et al. | 348/222.1 |
| 2002/0102029 | A1 | * | 8/2002 | Sekiguchi et al. | 382/243 |
| 2003/0016860 | A1 | * | 1/2003 | Sugawara | 382/151 |
| 2004/0234135 | A1 | * | 11/2004 | Nomizu | 382/209 |

FOREIGN PATENT DOCUMENTS

| | | |
|---|---|---|
| JP | 06-096214 | 4/1994 |
| JP | 06-104320 | 4/1994 |
| JP | 2000-293690 | 10/2000 |
| JP | 2004-228394 | 8/2004 |

OTHER PUBLICATIONS

Japanese Office Action, with partial translation, issued in Japanese patent Application No. 2008-150029, mailed Apr. 26, 2011.

* cited by examiner

*Primary Examiner* — Wesley Tucker  
*Assistant Examiner* — Aklilu Woldemariam  
(74) *Attorney, Agent, or Firm* — McDermott Will & Emery LLP

(57) ABSTRACT

A pattern matching apparatus comprising: means for storing photographed image data of a semiconductor device; means for storing CAD data of said semiconductor device; an information input means for inputting information on the white band width contained in said image data; a pattern extracting means for extracting a pattern on the semiconductor device from said image data by using the white band width information; and a matching means for matching said pattern with the CAD data.

25 Claims, 14 Drawing Sheets

*FIG. 4a*  *FIG. 4b*  *FIG. 4c*
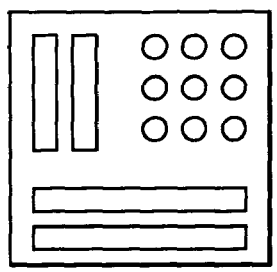
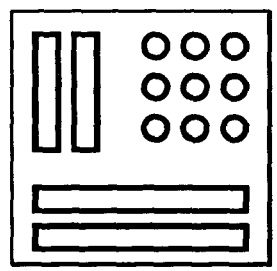
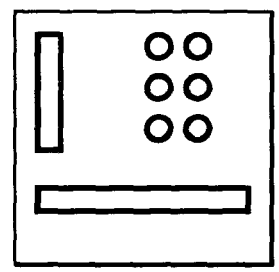
*FIG. 4d*  *FIG. 4e*
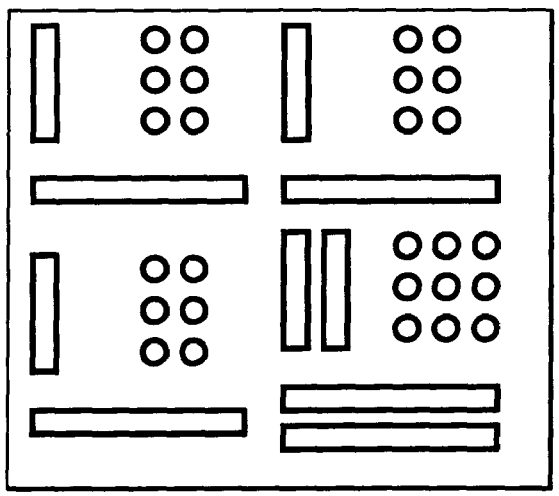
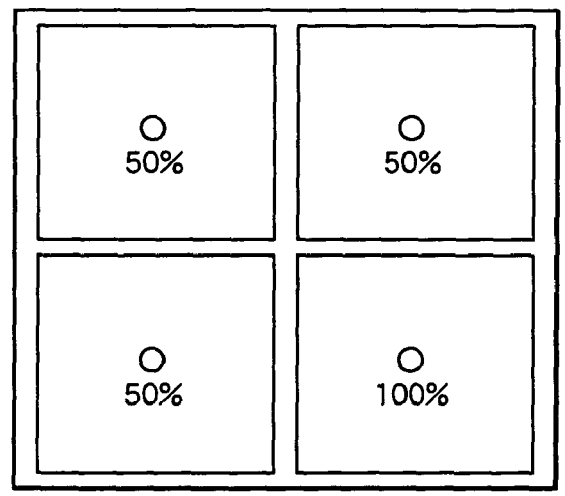

FIG. 6a

| K (0, 0) -1 | K (0, 1) 0 | K (0, 2) 2 | K (0, 3) 0 | K (0, 4) -1 |
|---|---|---|---|---|
| K (1, 0) -1 | K (1, 1) 0 | K (1, 2) 2 | K (1, 3) 0 | K (1, 4) -1 |
| K (2, 0) -1 | K (2, 1) 0 | K (2, 2) 2 | K (2, 3) 0 | K (2, 4) -1 |

FIG. 6b

| K (0, 0) -1 | K (0, 1) -1 | K (0, 2) -1 |
|---|---|---|
| K (1, 0) 0 | K (1, 1) 0 | K (1, 2) 0 |
| K (2, 0) 2 | K (2, 1) 2 | K (2, 2) 2 |
| K (3, 0) 0 | K (3, 1) 0 | K (3, 2) 0 |
| K (4, 0) -1 | K (4, 1) -1 | K (4, 2) -1 |

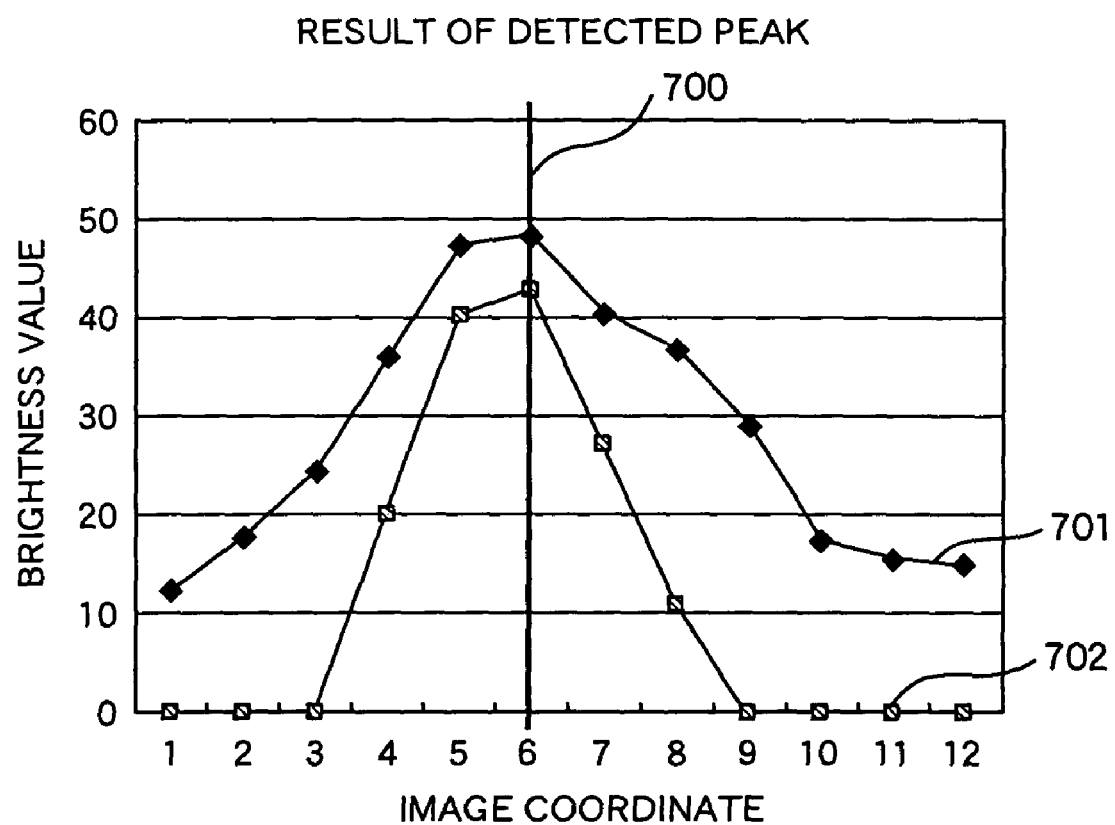

FIG. 10a
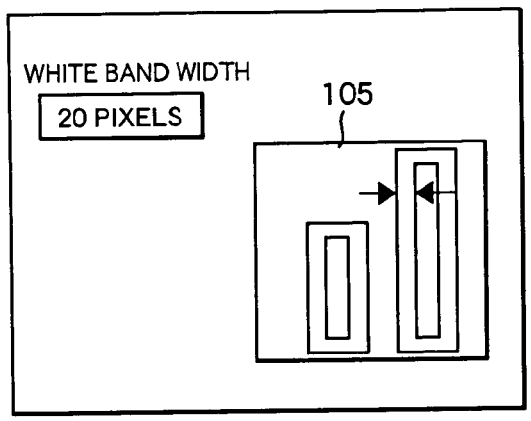
FIG. 10b
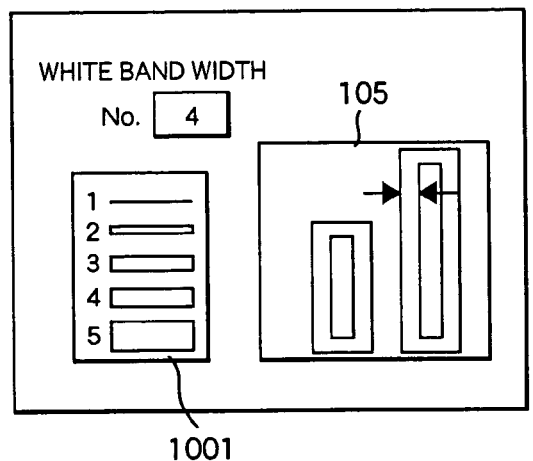
FIG. 11a
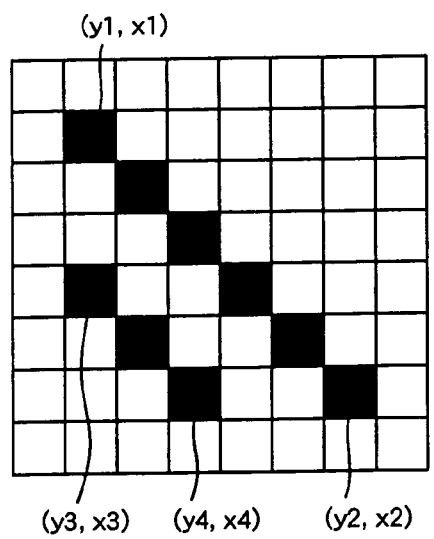
FIG. 11b
Line 1: (y1, x1) – (y2, x2)
Line 2: (y3, x3) – (y4, x4)

FIG. 20a

|  | | | | |
|---|---|---|---|---|
| In (0, 1) | In (0, 1) | In (0, 2) | In (0, 3) | In (0, 4) |
| In (1, 0) | In (1, 1) | In (1, 2) | In (1, 3) | In (1, 4) |
| In (2, 0) | In (2, 1) | In (2, 2) | In (2, 3) | In (2, 4) |
| In (3, 0) | In (3, 1) | In (3, 2) | In (3, 3) | In (3, 4) |
| In (4, 0) | In (4, 1) | In (4, 2) | In (4, 3) | In (4, 4) |

SEM IMAGE (INPUT [y] [x])

FIG. 20b

| K (0, 0) | K (0, 1) | K (0, 2) |
|---|---|---|
| K (1, 0) | K (1, 1) | K (1, 2) |
| K (2, 0) | K (2, 1) | K (2, 2) |

MATRIX OF FILTER (K [j] [i])

PATTERN MATCHING APPARATUS AND SCANNING ELECTRON MICROSCOPE USING THE SAME

CLAIM OF PRIORITY

This application claims priority from Japanese application serial No. 2004-244555, filed on Aug. 25, 2004, the content of which is hereby incorporated by reference into this application.

BACKGROUND OF THE INVENTION

1. Field of the Invention

The present invention relates to a pattern matching apparatus and a scanning electron microscope which extracts a pattern of a semiconductor device from a photographed semiconductor device image and matches CAD data of the semiconductor device with the pattern extracted from the photographed image of the semiconductor device, thereby making it possible to evaluate the pattern and search for an inspection position.

2. Related Art

Recently, minute patterns that are smaller than the wave length of a light source of an exposure device have been processed during a semiconductor manufacturing process by executing the optical proximity correction (OPC) of the reticle (an original pattern for exposure). The effects of such corrections are verified by matching the image of the semiconductor device photographed by a scanning electron microscope (hereafter, referred to as SEM) with CAD data information representing on the pattern.

In measuring a pattern on the semiconductor device, a pattern matching process that uses a template registered beforehand is conducted in order to identify a measuring position on the image photographed with the SEM. Generally, prior to the measuring inspection process, an image photographed with the SEM, the image being photographed of the vicinity of the measuring section on the semiconductor device is registered as the template; during the inspection process, the position that matches the template is searched for from the image of the semiconductor device photographed with the SEM. Then, measurement is conducted at the identified inspection position. However, frequently photographing images for templates during the measuring process results in significantly decreasing the throughput of the entire inspection process. Accordingly, it is required that templates be created by using CAD data, thereby eliminating the prior process and increasing the throughput of the entire inspection process.

[Patent document 1] Japanese Application Patent Laid-Open Publication No. Hei 06-104320

[Patent document 2] Japanese Application Patent Laid-Open Publication No. 2000-293690

A method or device disclosed in patent document 1 (Japanese Application Patent Laid-Open Publication No. Hei 06-104320) and patent document 2 (Japanese Application Patent Laid-Open Publication No. 2000-293690) conducts a pattern matching process by using the above-mentioned CAD data and an image of the semiconductor device photographed with the SEM. However, in the method disclosed in Japanese Application Patent Laid-Open Publication No. Hei 06-104320, a threshold value is provided to isolate SEM-specific noise from the pattern when extracting the pattern from the semiconductor device image photographed with the SEM. However, SEM noise changes according to the condition of the SEM imaging section or the condition of the specimen. Therefore, the threshold value must be frequently changed during the semiconductor inspection process, which may cause efficiency decreased in the inspection process. Also, the setting of the threshold value cannot be intuitively determined from the SEM image, and knowledge and experience of the image processing technique are required. As a result, there is a problem in that it is difficult for a SEM operator to make the settings.

Furthermore, Japanese Application Patent Laid-Open Publication No. 2000-293690 does not provide specific descriptions of the technique for extracting a pattern from the SEM image; the technique is important for conducting the matching process.

A SEM emits an electron beam onto a specimen, collects secondary electrons emitted from the irradiated surface of the specimen, amplifies them, and modulates the brightness thereby forming an image. Due to influences of noise generated by irregular thermal motion of electrons in the specimen or noise generated in peripheral circuits, random noise superimposes on a photographed image. Therefore, a pattern extracting technique that accurately separates noise from the pattern is required.

As stated above, when conducting a pattern matching process for the semiconductor inspection by using CAD data and a semiconductor device image photographed with the SEM, it is important to accurately isolate noise contained in the SEM image from the pattern. Also, in terms of inspection efficiency, image processing parameters used for the pattern matching process should be easily set without needing special knowledge about the image processing technique.

SUMMARY OF THE INVENTION

The present invention provides a pattern matching apparatus and a scanning electron microscope system, which can accurately isolate noise contained in the SEM image from the pattern by conducting a pattern matching process that use CAD data and the photographed semiconductor device image.

To achieve the above-mentioned object, a pattern matching apparatus according to embodiments of the present invention comprises;
 means for storing photographed image data,
 means for storing CAD data of the semiconductor device,
 an information input means for inputting information on the white band width contained in the image data,
 a pattern extracting means for extracting a pattern created on the semiconductor device from the image data by using the white band width information, and
 a matching means for matching the extracted pattern with the CAD data.

Furthermore, the pattern matching apparatus according to the embodiments of the present invention comprises;
 means for storing photographed image data,
 means for storing CAD data of the semiconductor device,
 an information input means for inputting information on the white band width contained in the image data,
 a pattern extracting means for extracting a pattern created on the semiconductor device from the image data by using the white band width information,
 a vectorization means for converting the extracted pattern into vector data, and
 a matching means for matching the vector data of the pattern with the CAD data.

Furthermore, in the pattern matching apparatus according to the present invention, the white band width information is the pixel width of the white band image contained in the image data.

Furthermore, in the pattern matching apparatus according to the present invention, the white band width information is a relative value with respect to a reference white band image data Furthermore, in the pattern matching apparatus according to the present invention, the shape of the pattern extracted from the image data is changed by changing the white band width information.

Furthermore, in the pattern matching apparatus according to the embodiments of the present invention, the input means includes a means for inputting information on a direction of the pattern to be detected on the semiconductor device.

Furthermore, in the pattern matching apparatus according to the embodiments of the present invention, the pattern extracting means includes a function to adjust the result of filtering to extract a pattern according to the information on a direction of the pattern.

Furthermore, in the pattern matching apparatus according to the embodiments of the present invention, the input means includes a means for inputting information on the number of combined pixels to determine whether to vectorize the pixels or not to set a parameter for converting the pattern extracted from the image data photographed by the electron microscope into vector data.

In the pattern matching apparatus according to the embodiments of the present invention, the vectorization means uses information on the number of combined pixels that are to be vectorized or not to be vectorized in order to select pixels to be vectorized and execute the vectorization process.

Furthermore, in the pattern matching apparatus according to the embodiments of the present invention, the input means includes a means for inputting information on the distance between a straight line created by combined pixels of the pattern and a pixel that exists between combined pixels to set the parameter for converting the pattern extracted from the image data photographed by the electron microscope into vector data.

Furthermore, in the pattern matching apparatus according to the embodiments of the present invention, the vectorization means uses information on the distance between a straight line created by combined pixels of the pattern and the pixel that exists between combined pixels in order to approximate the pattern to the straight line information thereby executing the vectorization process.

Furthermore, in the pattern matching apparatus according to the embodiments of the present invention, the input means includes a means for inputting information on the angle of the straight line created by combined pixels of the pattern to set the parameter for converting a pattern extracted from the image data photographed by the electron microscope into vector data.

Furthermore, in the pattern matching apparatus according to the embodiments of the present invention, the vectorization means uses information about the angle of a straight line created by combined pixels of a pattern in order to select a pattern to be outputted as vector data and output it.

Furthermore, the present invention provides a scanning electron microscope system, which comprises:
  the image processing unit that includes the above-mentioned pattern matching apparatus,
  a control computer for controlling a scanning electron microscope and the image processing unit,
  an input means for inputting parameters for operating the scanning electron microscope and executing pattern matching, and
  a display unit for displaying image data sent from the scanning electron microscope and results of the pattern matching process.

Furthermore, the present invention provides an inspection system, which comprises:
  a computer which can receive image data sent from a scanning electron microscope and CAD data from a scanning electron microscope and a computer via a network or an externally connected memory,
  an input means for inputting a parameter for executing pattern matching, and
  a display unit for displaying image data sent from the scanning electron microscope and the result of the pattern matching process, wherein
  the above-mentioned functions of the pattern matching apparatus are executed by software.

The scanning electron microscope system according to the present invention uses image processing parameters with respect to the white band width in order to accurately extract a pattern contained in an SEM image and match the extracted pattern with CAD data. Therefore, it is possible to accurately match the pattern of a specimen photographed by a SEM with CAD data and also to accurately detect the position that matches the position in the SEM image from within the CAD data.

BRIEF DESCRIPTION OF THE DRAWINGS

FIG. 4 shows a SEM image and CAD data that are used by a pattern matching apparatus according to the present invention.

FIG. 6 shows the matrix coefficient used for extracting a pattern.

FIG. 7 shows the SEM image coordinates and the brightness profile of the extracted pattern of the SEM image.

FIG. 10 shows the screen on which white band information is inputted.

FIG. 11 shows the outline of the vectorization process.

FIG. 20 shows an example of the filtering process that uses the matrix of the image processing parameters.

DETAILED DESCRIPTION OF THE EMBODIMENTS

Figure 1:
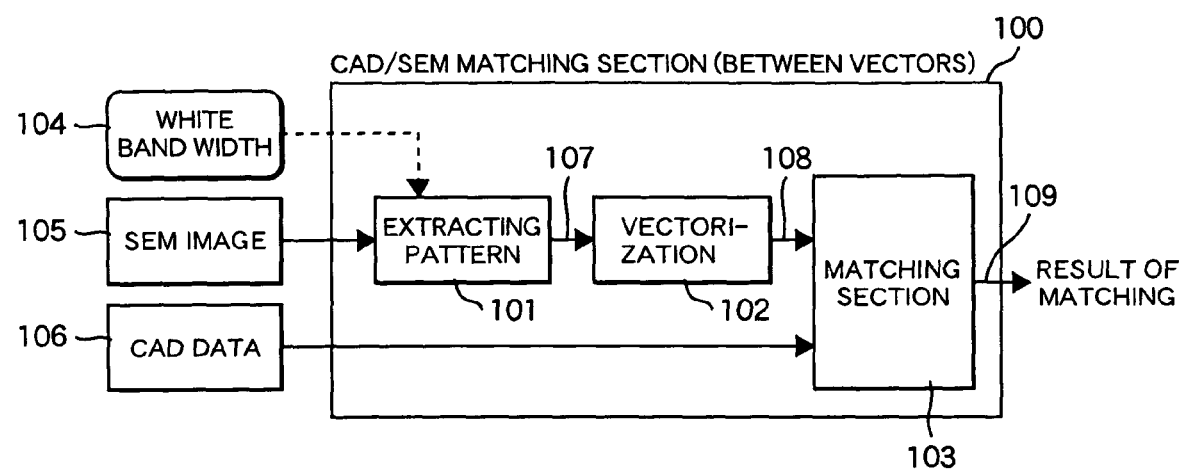
FIG. 1 is a block diagram that shows a pattern matching apparatus of embodiment 1 according to the present invention.

FIG. 1 is a block diagram that shows the basic configuration of a pattern matching apparatus 100 according to the present invention. The pattern matching apparatus of the present invention matching the design data 106 for manufacturing the semiconductor device and bettor data 108, which prepared by extracting a pattern image 107 on a semiconductor device from an image 105 (hereafter, referred to as SEM image) photographed by a scanning electron microscope (hereafter, referred to as SEM), converting the extracted pattern image into vector data 108 that has the same format as the CAD data, executing the pattern matching of the CAD data 106 with the vector data 108, and outputting the matching value 109. Hereafter, details of the pattern matching apparatus of the embodiments according to the present invention will be explained by using embodiments.

A pattern matching apparatus 100 according to the embodiments of the present invention can be applied to a system for inspecting semiconductor devices. For example, in the inspection process for the OPC that makes fine processing of a semiconductor device, it is necessary to evaluate a pattern on a semiconductor device by comparing CAD data. Accordingly, when using CAD data that shows a portion to be inspected in order to search an image photographed with the SEM for a pattern that matches the CAD data, it is possible to use a pattern matching apparatus according to the present invention. In this case, the result of the matching process (degree of pattern matching) can be used as one item of the pattern evaluation.

Furthermore, for the measuring inspection that measures a pattern on a semiconductor device or for the defect inspection that inspects foreign objects or defect on the semiconductor device, a pattern matching apparatus 100 according to the present invention can be used to detect an inspection target from the SEM image. Specifically, in order to detect the pattern to be inspected from the semiconductor device image photographed with the SEM, by using CAD data of a unique pattern that exists around the pattern as a template and also using the pattern matching technique, a position of the pattern that is most similar to the shape of the template is obtained from the SEM image. By doing so, an inspection position can be identified according to the relationship between the matching position information and the inspection position, thereby making it possible to conduct accurate inspection.

Thus, the pattern matching technique of CAD data with the image of the semiconductor device can be used in various ways according to purposes of semiconductor inspections.

Embodiment 1

Figure 2:
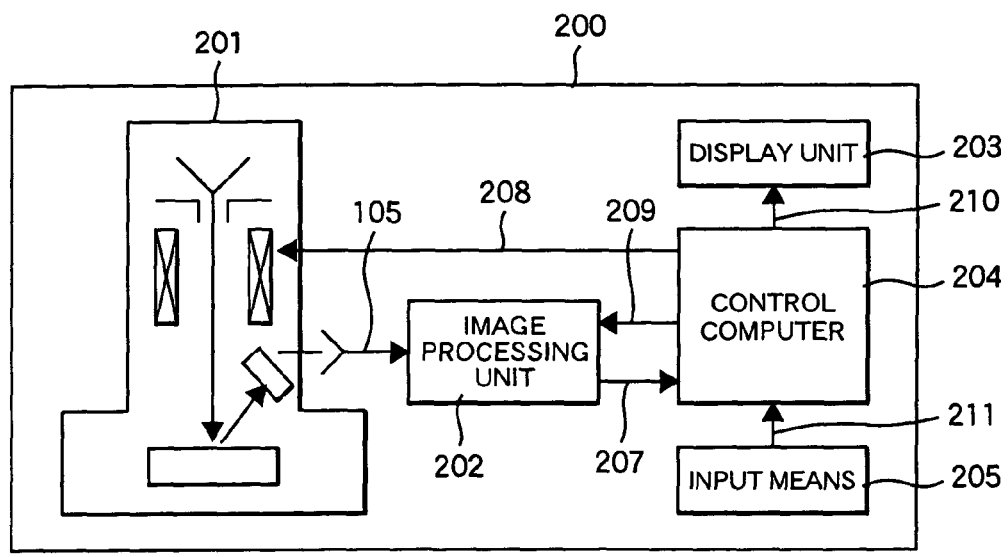
FIG. 2 is a schematic diagram of a scanning electron microscope system that includes a pattern matching apparatus according to the present invention.

FIG. 2 shows the configuration of the scanning electron microscope system 200 in which the pattern matching apparatus 100 according to the present invention is applied to an image processing unit 202.

The scanning electron microscope system 200 comprises the SEM 201 which photographs an image of the semiconductor device; an image processing unit 202 which reduces SEM-specific noise contained in the SEM image 105 and executes the pattern matching process of the present invention; a control computer 204 for controlling the SEM 201 and the image processing unit 202; an input means 205 for inputting control data 211 used for controlling the scanning electron microscope system 200; and a display unit 203 which displays the n image photographed with the SEM 201, image processing results and indication data 210 for controlling the scanning electron microscope system 200.

Hereafter, each of the units that make up the system will be explained.

The control computer 204 controls the entire scanning electron microscope system 200; for example, it controls the photographing condition of the SEM 201, an inspection position of a semiconductor device and the setting of the image processing function of the image processing unit 202. The control computer 204 is an information processing unit typified by a personal computer or a workstation, and comprises a memory for storing CAD data 106 of the semiconductor device, SEM image 105, and a program for controlling the SEM 201 and the image processing unit 202; a CPU which executes the control program; a signal input IF for inputting the image processing results 207, such as the SEM image or the pattern matching value 109, from the image processing unit 202; and the signal output IF which outputs SEM control data 208 for controlling the SEM 201, image processing unit 202 control data, and image processing data 209, such as the SEM image 105, that is to be sent to the image processing function.

A variety of interfaces, such as a USB, IEEE1394, Centronics interface, memory card, PCI, and Ethernet (registered trademark), can be used as a signal input IF and a signal output IF; and SDRAM, SRAM, DRAM, ROM, memory card, and hard disk can be used as a memory.

The input means 205 is for the operator to specify photographing conditions of the SEM 201, the inspection position of the semiconductor device, the position of the CAD data that corresponds to the inspection position, and settings of the image processing function to operate a control computer 204. The input means 205 includes a mouse and a keyboard that are connected to the control computer 204. The display unit 203 displays a SEM image 105 photographed by a SEM 201 and indication data 210, such as a pattern matching value 109, information on the inspection position on the semiconductor device, data related to the SEM 201 and image processing unit 202, and CAD data 106. The display unit 203 includes the image display unit, such as a cathode ray tube (CRT) or a liquid crystal display that is connected to the control computer 204.

The SEM 201 emits an electron beam onto the specimen while raster-scanning the surface of the specimen, detects and amplifies secondary electrons and reflection electrons generated from the specimen surface, and then converts the electrons into brightness information, thereby acquiring the SEM image 105 of the specimen. The image processing unit 202 comprises a memory for storing the SEM image 105, results of the pattern matching process, and results of image processing function; a CPU which controls an image processing program and the entire image processing function according to the instructions by the control computer 204; hardware, such as an application specific integrated circuit (ASIC) and a field programmable gate array (FPGA), for quickly executing the image processing function; a signal input IF1 for inputting a SEM image 105; a signal input IF2 for inputting, from the control computer 204, a SEM image 105 used for the pattern matching process and image processing data 209 used for the image processing function; and a signal output IF for transferring data, such as a SEM image and results of image processing 207 to the control computer 204.

Moreover, similarly to the control computer 204, the image processing unit 202 can include a variety of interfaces, such as the USB, IEEE1394, Centronics interface, memory card, PCI, and Ethernet, as a signal input IF1, signal input IF2, and a signal output IF; and also include an SDRAM, SRAM, DRAM, ROM, memory card, and a hard disk as a memory.

The pattern matching apparatus 100 according to the present invention can be constituted by combining hardware, such as the FPGA and ASIC, with software operated by the CPU. Hereafter, with reference to FIG. 1, the pattern matching apparatus 100 according to the present invention will be explained in detail.

The pattern matching apparatus 100 according to the present invention inputs CAD data 106 of the semiconductor device, SEM image 105, and information 104 about the white band width to extract the pattern image 107 on the semiconductor device from the SEM image 105, thereby extracting the pattern image 107 contained in the SEM image 105 with high accuracy; converts the extracted pattern image 107 into vector data 108 used for matching with the CAD data; executes the pattern matching of the CAD data 106 with the vector data 108 extracted from the SEM image 105; and then outputs the matching value 109.

Next, with reference to FIG. 3, an embodiment of the pattern matching apparatus 100 according to the present invention in which a white band is used as image information.

Figure 3A:
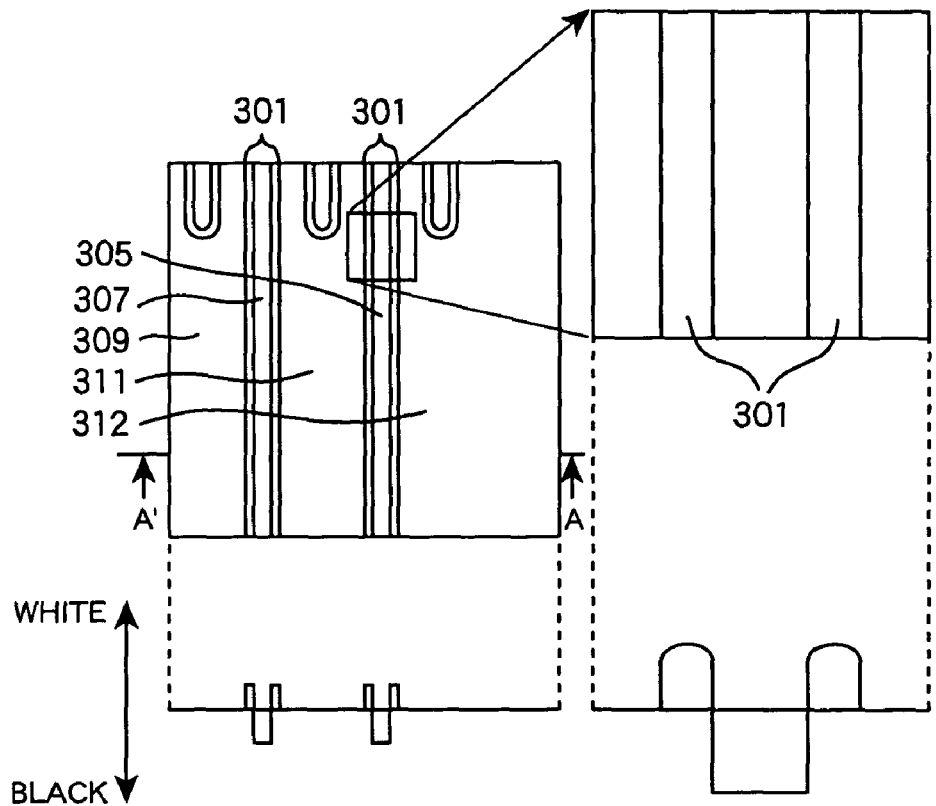
FIG. 3 shows the relationship between the white band in a SEM image and the pattern of the CAD data.
Figure 3B:
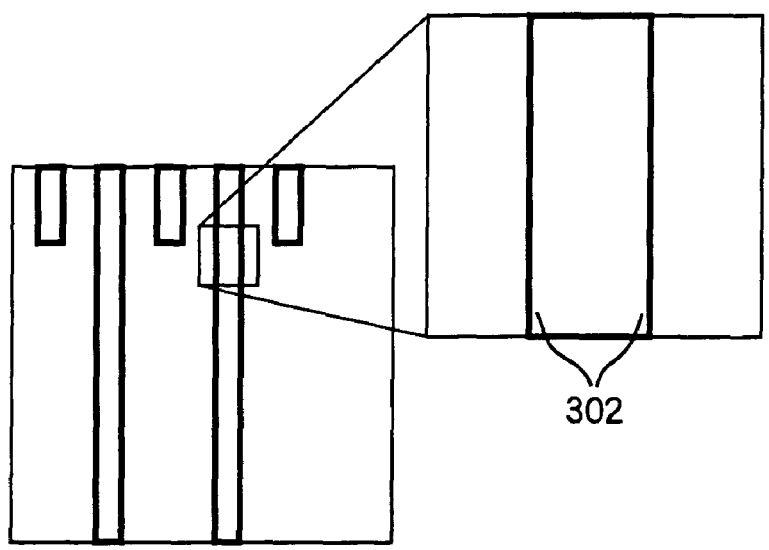

Herein, FIG. 3(a) shows information on a plan SEM image, and FIG. 3(b) shows a sectional view taken substantially along the line A-A in FIG. 3(a). FIG. 3(c) is an image of the CAD data that corresponds to the pattern shown in FIG. 3(a).

Herein, as shown in FIG. 3(a), the white band is SEM-specific image information, which occurs on a pattern having an inclination or a protrusion 301 when an electron beam is emitted onto the semiconductor device. In FIG. 3(a), protrusions 301 and 302 extending upwardly from the semiconductor wafer (hereafter, referred to as wafer) appear in white as shown in FIG. 5(a), which will be described later in this document. And, recessed portions 305 and 307 on the wafer appear as a darker shade than the flat portions 309, 310 and 311.

Furthermore, FIG. 3(c) shows an image of the CAD data that corresponds to the pattern shown in FIG. 3(a). As shown in the drawings, the location of the protrusion 301 corresponds to the CAD data 302.

Furthermore, the matching value 109 outputted by the pattern matching apparatus 100 according to the present invention indicates the degree of pattern matching between the CAD data 106 and the vector data 108. For example, when the pattern of the CAD data shown in FIG. 4(a) is compared with each of the SEM images shown in FIGS. 4(b) and 4(c), the matching value 109 indicates that the pattern of FIG. 4(b) is more similar to the pattern of the CAD data than the pattern of FIG. 4(c).

Furthermore, the pattern matching apparatus 100 according to the present invention can be used in searching the SEM image 105 for the image position that matches the CAD data 106, or when searching the CAD data 106 for a position that matches the SEM image 105. In this case, the results of pattern matching indicate a coordinate position of the CAD data 106 within the SEM image 105 or a coordinate position of the SEM image 105 within the CAD data 106. For example, in order to detect a position of an image, from the SEM image shown in FIG. 4(d), that has the same pattern as CAD data shown in FIG. 4(a), each of the areas that constitute the SEM image is compared with the CAD data, as shown in FIG. 4(e), by conducting a pattern matching process to obtain the degree of pattern matching; and information about a coordinate position that has the highest degree of pattern matching can be outputted as the result of the pattern matching process.

To execute the pattern matching process as described above, a pattern matching apparatus 100 according to the present invention comprises a pattern extracting section 101 which extracts the pattern on a semiconductor device from the SEM image 105 by using white band width information 104 and creates an image of the extracted pattern 107; a vectorization section 102 which converts the pattern image 107 into vector data 108; and a matching section 103 which matches the CAD data 106 with the vector data 108 which has been extracted from the SEM image 105 and outputs the matching value 109. Moreover, elements that constitute the pattern matching apparatus 100 according to the present invention can be hardware, such as the CPU, memory, signal input IF, signal output IF, ASIC, and FPGA, which is installed in the image processing unit 202. Furthermore, CAD data 106 and white band, width information 104 are to be inputted into a pattern matching apparatus 100 located in the image processing unit 202 via a control computer 204 according to the control of the input means 205 of the scanning electron microscope system 200. Hereafter, elements that constitute the pattern matching apparatus 100 according to the present invention will be described.

Next, elements that constitute the pattern matching apparatus 100 according to the present invention will be described in detail.

Figure 5:
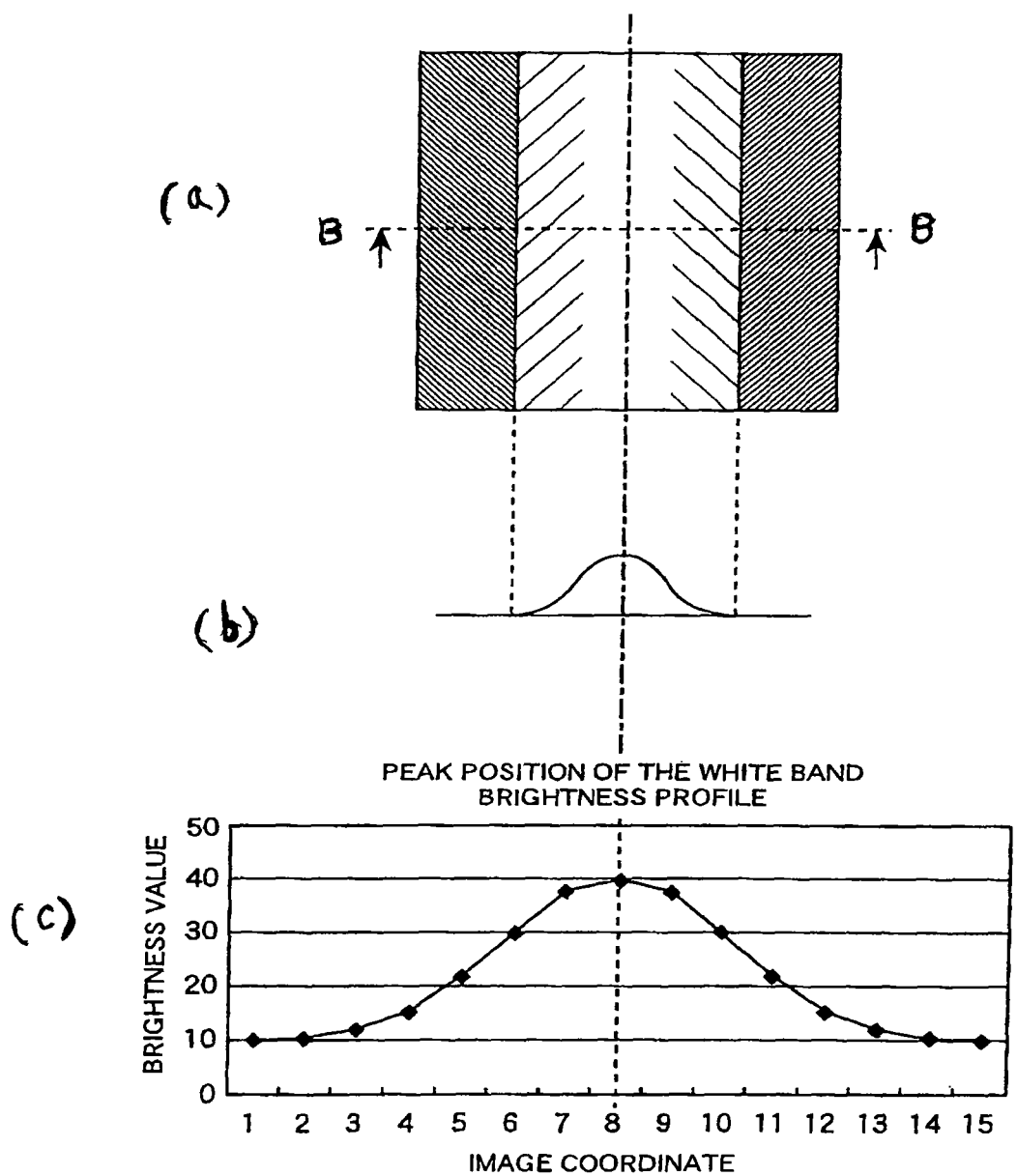
FIG. 5 shows the brightness profile of the white band.

FIG. 5 shows a corresponding relationship between the white band on the SEM image and the peak position of the white band brightness profile; FIG. 5(a) shows white band image information; FIG. 5(b) shows a sectional view taken substantially along the line B-B in FIG. 5(a); and FIG. 5(c) shows the peak position of the white band brightness profile.

The pattern extracting section 101 uses white band width information 104 inputted into a pattern matching apparatus 100 according to the present invention so as to extract the pattern on the semiconductor device from the SEM image 105 and create the image of the extracted pattern 107. The CAD data 106 is information on the line that connects coordinates of the start point and coordinates of the end point. The white band on the SEM image 105 that corresponds to the pattern of the CAD data 106 is image information having a width as shown in FIG. 5(b) and has a convex-shaped brightness distribution. Therefore, to execute a highly accurate pattern matching process, it is necessary to extract a line that corresponds to the CAD data 106 from the image of the white band located in the SEM image. Because the area around the white band peak position corresponds to the pattern of the CAD data 106, the pattern extracting section 101 reduces noise contained in the SEM image 105 and creates an image in which the area around the white band peak position has been extracted.

Hereafter, operations of the pattern extracting section 101 will be described. Normally, the SEM image 105 contains many noise components during the photographing process, and therefore, a technique is necessary to extract the image of the area around the white band peak position while removing the noise components. For this purpose, by using the characteristic patterns created on the semiconductor device that are continuously distributed in both the vertical and horizontal directions, the matrix of the image processing parameter for the white band having coefficients shown in FIGS. 6(a) and 6(b) are used for each of the vertical and horizontal directions to conduct a filtering process.

The value of each matrix shown in FIGS. 6(a) and 6(b) indicates an image processing parameter, and actually, those values are inputted into a memory of the system and stored.

Furthermore, an example of the filtering process that uses matrices of the image processing parameters will be explained with reference to FIG. 20. FIG. 20(a) shows the matrix (Input [y] [x]) of each pixel image memory that stores the brightness value of the SEM image, and FIG. 20(b) shows the matrix (K [j] [i]) of the image processing parameter for the filtering process.

When the filtering process is conducted, the 3×3 matrix shown in FIG. 20(b) is scanned for the brightness value of each pixel memory from a pixel memory located at the top left of the SEM image 105 to a pixel memory located at the bottom right. At this time, the brightness value of each pixel of the SEM image 288 shown in FIG. 20(a) is multiplied by each coefficient that corresponds to the position of each coefficient of the image processing parameter of the matrix shown in FIG. 20(b) according to the formula 1 and then the multiplication result at each pixel position is added, thereby extracting information (output [y] [x]) that corresponds to the image processing parameter from the pixel data. In an actual system, the filtering process can be executed by means of hardware which includes a multiplier for multiplying each coefficient by each pixel's brightness value, and an adder for adding the multiplication result at each pixel position.

Output[y]/[x]=ΣΣInput[y+j][x+i]·K[j][i]            (Formula 1)

The matrix shown in FIGS. 6(a) and 6(b) extracts a convex-shaped brightness pattern that is continuously distributed within the range of several pixels on the image and emphasizes the brightness pattern of the white band in which there is a large difference between the brightness value of the pixel at the peak position of the convex-shaped white band and the brightness value of the pixel in the inclined sections that exist on both sides of the convex-shaped peak position.

By using a matrix of the image processing parameter shown in FIG. 6(a), it is possible to extract information on the convex-shaped white band that continues in the vertical direction. When using a matrix of the image processing parameter shown in FIG. 6(b), the matrix of the image processing parameter is for the filtering operation that extracts information about the convex-shaped white band that continues in the horizontal direction.

FIG. 7 shows the brightness profile 702 of the result of the filtering operation that uses the matrix of the image processing parameter shown in FIG. 6(a) with respect to the brightness profile 701 of the image in which SEM-specific noise is added to the white band that continues in the vertical direction as shown in FIG. 5. Thus, in the event the shape of the white band deteriorates due to the influence of SEM-specific noise, it is possible to obtain the result, which emphasizes the peak position 700 of the white band that continues in the vertical direction by using the matrix of the image processing parameter for the white band that continues in the vertical direction and to conduct the filtering operation.

Figure 8A:
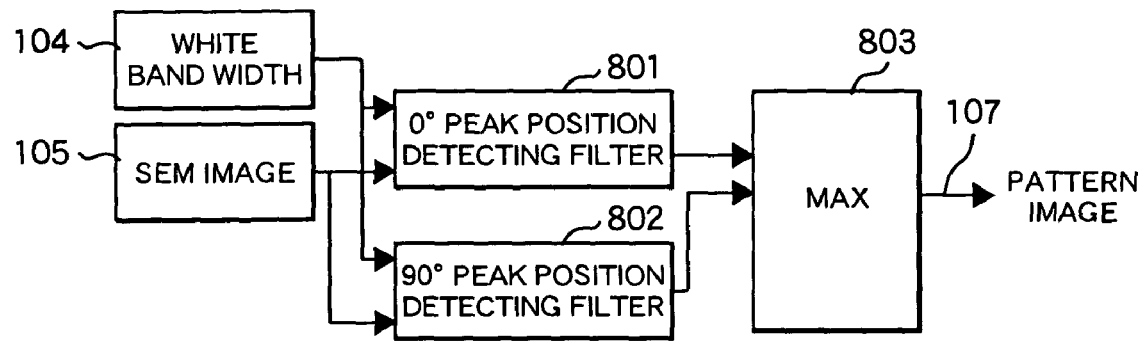
FIG. 8 is a block diagram that shows the configuration of the pattern extracting section.

FIG. 8 shows the configuration of the pattern image 107 for creating an image that has extracted patterns in both the vertical and horizontal directions by means of the filtering operation that uses two matrices of the image processing parameters shown in FIGS. 6(a) and 6(b). By making the configuration which includes a 0-degree direction detecting filter section 801 for conducting the filtering operation of the SEM image 105 by using a matrix shown in FIG. 5(a); a 90-degree peak detecting filter section 802 for conducting the filtering operation by using a matrix shown in FIG. 5(b); and a maximum value detecting section 803 which determines the highest output result to be a final output, it is possible to detect a peak position of the white band that continues in both the vertical and horizontal directions. Such a pattern extracting section 101 comprises hardware that includes a memory for storing white band width information 104 and a SEM image 105; a 0-degree or 90-degree peak detecting filter section 801 and 802 including a previously-mentioned multiplier and an adder; and a maximum value detecting section 803 which compares two filtering results and outputs the result of the pattern detecting process.

Figure 8B:
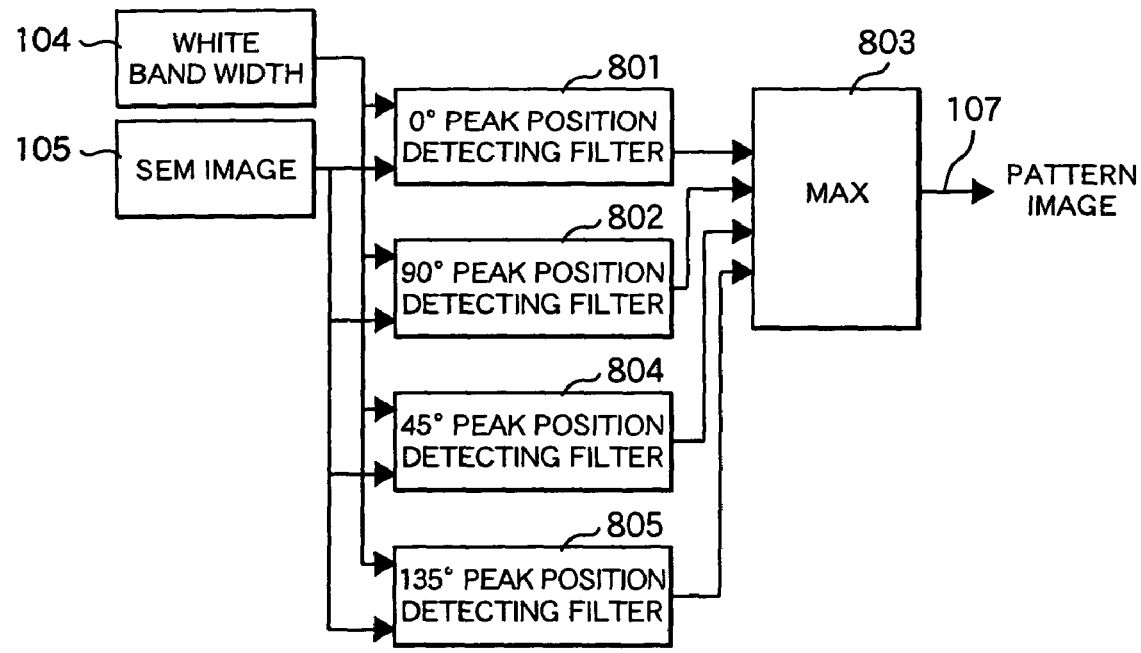

Furthermore, when detecting a peak position of the white band that continues, for example, in an oblique direction (45 degrees, 135 degrees) in addition to both the vertical and the horizontal directions, by providing the filter section with a matrix having a coefficient for detecting that direction and making a configuration shown in FIG. 8(b), it is possible to extract a pattern which continues in the vertical, horizontal, and oblique directions. Furthermore, when extracting a pattern that continues only in the vertical direction, it is sufficient to conduct the filtering operation that uses a matrix coefficient shown in FIG. 5(a). When arbitrarily specifying a desired direction to extract a pattern, for example, it is sufficient to provide the configuration shown in FIG. 8(b) with a pattern image 107 and provide each filter section 801, 802, 803, and 804 with a mechanism for controlling the filtered outputs. For example, direction information about a desired pattern to be detected is inputted from an input means 205 of the scanning electron microscope system 200 and stored in the memory of an image processing unit 202 of the present invention via a control computer 204. Each filter section refers to a preset value with respect to the detecting direction, and a filter which has no detection setting is always set at 0. By doing so, the filtering result of the filter that has no detection setting is not outputted, and only the white band that continues in an arbitrarily specified direction can be extracted.

Next, the relationship between the size of the white band width and the size of the matrix of the image processing parameter used for the filtering operation will be explained.

If the size of the matrix of the image processing parameter is fixed when the filtering operation is conducted, it may not be possible to properly detect a pattern. This is because an inclination of the convex shape at a peak position becomes moderate as the white band width increases. For example, when conducting the filtering operation that uses matrices shown in FIGS. 6(a) and 6(b), the peak position is detected by using information about inclination between the brightness value of the white band at the peak position and the brightness value of the inclined section that exists on both sides of the peak. Therefore, for example, if the size of the matrix in the horizontal direction is fixed by parameters shown in FIG. 6(a) such that the number of pixels is 5, and the K value of the filter coefficient K (0 to 2, 1) and K (0 to 2, 3) is 0, when a white band is wide, in other words, when the white band is wide in terms of pixel value, it is not possible to detect a peak position with respect to an image of a white band which has a small inclination of the inclined section around the peak position.

Figure 9A:
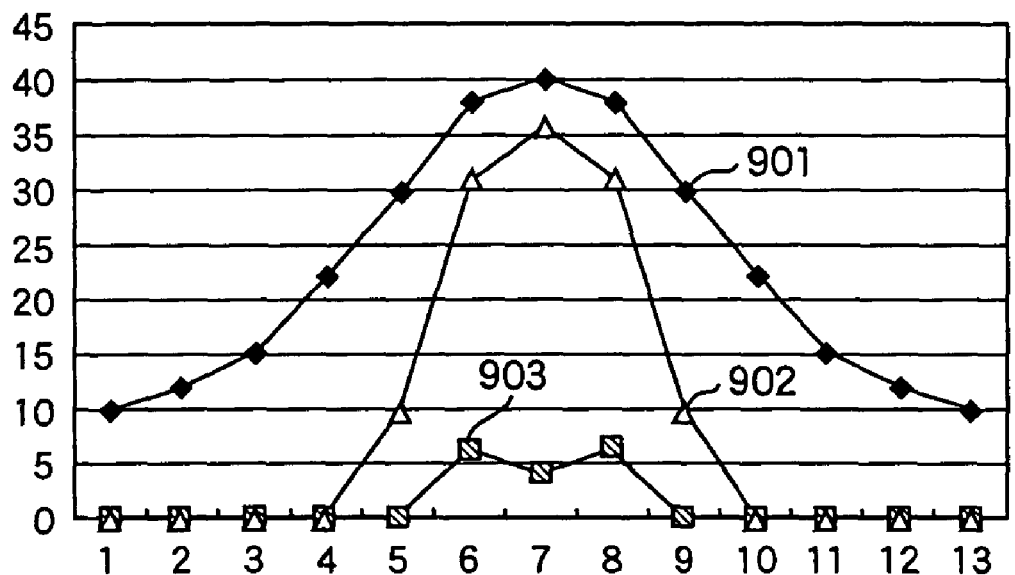
FIG. 9 is a brightness profile that shows the changes of the pattern extracting results according to the white band width and the size of the matrix.

FIG. 9(a) shows an example in which two kinds of filters that have different matrix sizes are used with respect to a brightness profile 901 of a SEM image.

To extract information about the convex-shaped white band that continues in the vertical direction, the first filter, which is an alteration of the filter shown in FIG. 6(a), is used in which the number of pixels of the matrix in the horizontal direction is 9, the K value of the filter coefficient K (0 to 2,1), K (0 to 2,2), K (0 to 2,3), K (0 to 2,5), K (0 to 2,6) and K (0 to 2,7) is 0, the K value of the filter coefficient K (0 to 2,0) and K (0 to 2,8) is −1, and the K value of the filter coefficient K (0 to 2,4) is 2. The graph shows the brightness profile 902 for that situation.

The filter coefficient (the number of pixels of the matrix in the horizontal direction is 5) shown in FIG. 6(*a*) is used for the second filter. The graph shows the brightness profile 903 for that situation.

In the case of the matrix in which the number of pixels is 5, the result of filtering is poor because the filter size is smaller compared to the white band width. In the case of the matrix in which the number of pixels is 9, the peak position is properly extracted because the white band width is similar to the filter size.

Figure 9B:
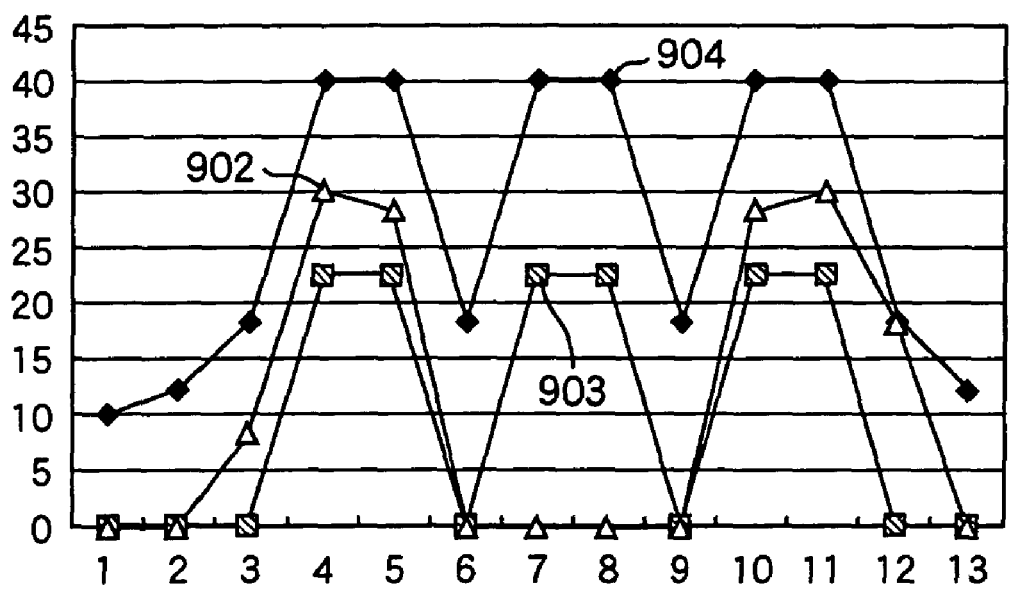

Furthermore, when the white band width is smaller than the filter size, for example, as shown in FIG. 9(*b*), when the brightness profile 904 of the SEM image of the white band is made up of patterns having a small white band width that are continuously arrayed in the vertical direction in narrow intervals; if the above-mentioned filter having 9 pixels in the matrix is used, as the graph of the brightness profile 902 shows, patterns interfere with one another because the filter size is larger than the white band. Consequently, it is impossible to properly detect a peak position. On the contrary, if the above-mentioned filter having 5 pixels in the matrix is used, it possible to properly detect a peak position, as the graph of the brightness profile 903 shows, because the white band width is almost the same as the filter size.

Thus, white band width information 104 must be specified by an operator of the pattern matching apparatus 100. The pattern extracting section 101 changes the size of the matrix according to the white band width information 104 and conducts the filtering operation. The white band width information 104 can be intuitively acquired by referring to the SEM image and does not require special knowledge about the image processing technique, and therefore, it is easily determined.

FIG. 10 shows an embodiment in which the matrix size is determined according to the white band width information.

Possible procedures for setting the matrix size of the filter used for the filtering operation based on the white band width information are shown in FIG. 10(*a*). Specifically, a SEM image 105 is displayed on a part of the display unit 203 of the scanning electron microscope system 200; an operator of the scanning electron microscope system 200 estimates a pixel width of the white band image from the SEM image; inputs the value from the input means 205; and registers the value in the image processing unit's memory via the control computer 204.

Furthermore, as shown in FIG. 10(*b*), the kernel size that uses a specific white band reference pattern 1001 as a reference is displayed on a part of the display unit 203; an operator determines the matrix size according to the relationship between the reference pattern and an actual pattern; and saves the value in the memory located in the image processing unit 202 via the control computer 204.

Furthermore, in FIGS. 10(*a*) and 10(*b*), the pixel width is used as the unit to input a white band image. However, instead of using the pixel width for displaying and inputting the image, it is possible to display the width of an actual white band image and for an operator to input a value of the size. In this case, by converting the size of the actual white band image into the size of pixel when the filtering operation is conducted, it is possible to apply previously-mentioned procedures.

Figure 19:
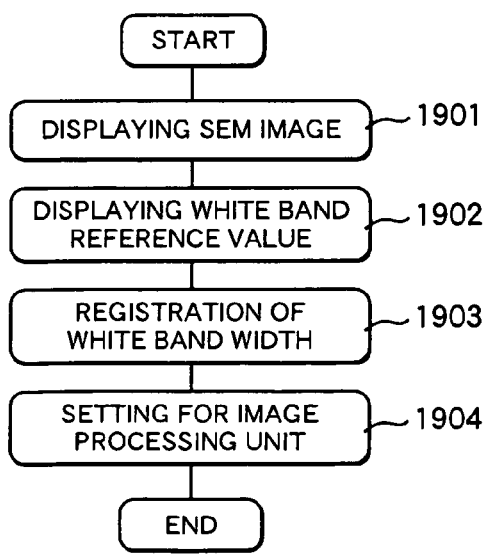
FIG. 19 is a flow chart that shows the function that registers white band width information for the pattern matching process according to the present invention.

Setting of the white band width is executed by the white band width registration program operated by the control computer 204 according to the flow chart shown in FIG. 19.

After an operator has activated a white band width registration program, a SEM image 105 that is targeted for the pattern matching operation is displayed on the display unit 203 (step 1901). Furthermore, when an operator is provided with a white band reference value, the white band and the reference value of the width are displayed on the display unit 203 (step 1902). The set value of the white band width inputted by the operator is stored in the memory (step 1903). The set value of the white band width is stored in the memory of the image processing unit 202 (step 1904), and the program is terminated. Furthermore, if the white band width can be presumed without displaying a SEM image 105 as stated above, procedures 1901 and 1902 can be omitted from the program.

Next, a vectorization section of the pattern matching apparatus according to the present invention will be explained.

The vectorization section 102 converts a pattern image 107 that has been filtered by the pattern extracting section 101 into vector data 108. Herein, vector data 108 is information about lines that constitute a pattern. Information about coordinates of the start point and the end point of each straight line is detected from an image of the extracted pattern as shown in FIG. 11(*a*) and the vector data 108 as shown in FIG. 11(*b*) is finally outputted. Since CAD data is provided in the form of vector data, by creating vector data of the pattern of the SEM image 105 in the vectorization section 102, it is possible for the matching section 103 to conduct the pattern matching of the two pieces of vector data.

Figure 12:
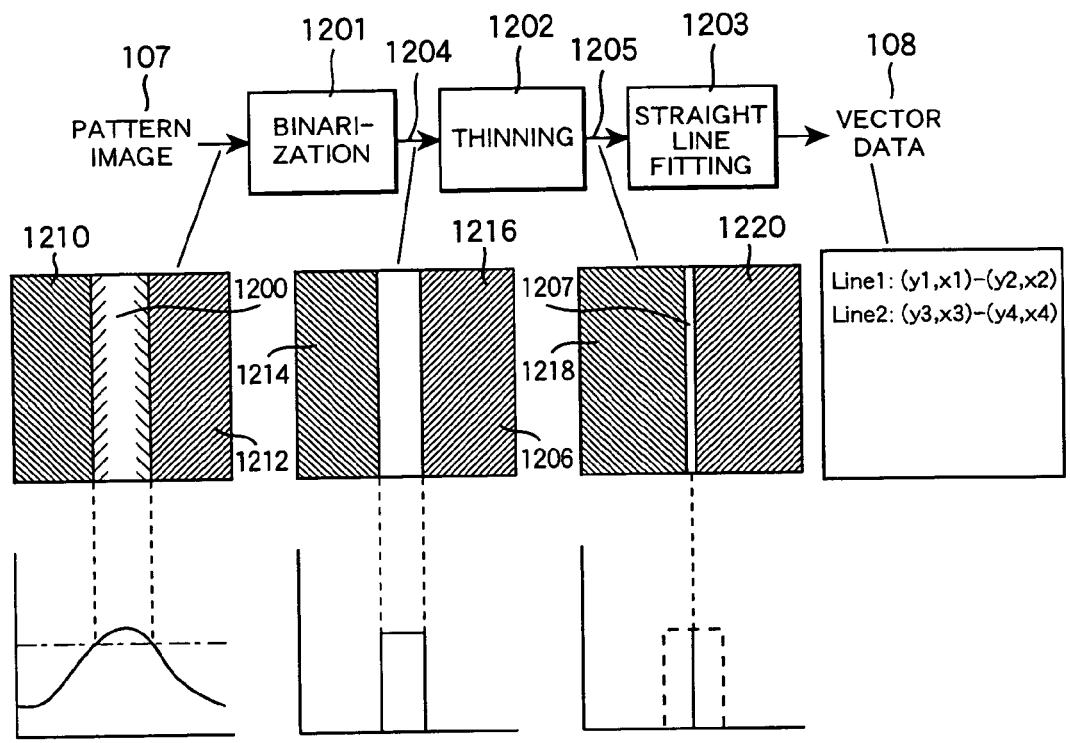
FIG. 12 shows the functional block of the vectorization section.

FIG. 12 shows a vectorization method. s FIG. 12 shows a vectorization method, vector data can be created by executing a binarization process 1201, thinning process 1202, and a straight-line fitting process 1203.

The binarization 1201 process is to convert a pattern image 107 that has been filtered and extracted into a binary image 1204. For example, as shown in FIG. 9, an extracted pattern image 107 is a multi-tone image having brightness values from 0 to 255, and it cannot be converted into vector data 108. Therefore, by providing a certain threshold value, the image with tones of 0 to 255 is converted into a two-tone image of 0 and 1, which is a binary image 1204. As a binarization method, there is a well-known technique by which a threshold value is beforehand determined and then binarization is conducted. The binarization section can include hardware such as a comparator that compares the threshold value with each pixel brightness value, and outputs number "1" when the brightness value is higher than the threshold value, and outputs "0" when the brightness value is lower than the threshold value. The binarization technique, for example, disclosed in Japanese Application Patent Laid-Open Publication No. Hei 06-104320 [patent document 1] can be used.

Next, the thinning 1202 process is conducted so as to detect the central line of the binary pattern image. As shown in the binary image 1206, in some cases, the white band width has a width equal to a plurality of pixels after it has been binarized. Accordingly, by detecting the central line of the white band width shown in the thinned image 1207, it becomes possible to vectorize the central line, thereby making it possible to obtain one straight line that corresponds to one white band.

As a thinning method, there is a known technique that uses a template image which locally shows the shape of the boundary between the white band and the background 1214 and 1216 (black portion of the drawing) to detect an area of a pattern image that matches the template image, successively replaces the binary white band image 1206 with a black pixel starting from the background 1214 and 1216 side toward the center of the line until the last central pixel remains, thereby detecting the central line that remains eventually. The thinning section can include hardware such as a comparator that compares each pixel of the template image with each pixel of a pattern image, and when the template image matches the pattern image, the thinning section replaces the brightness value of the pattern image with a black pixel, and when the template image does not match the pattern image, it outputs the current brightness value of the pattern image.

Figure 13A:
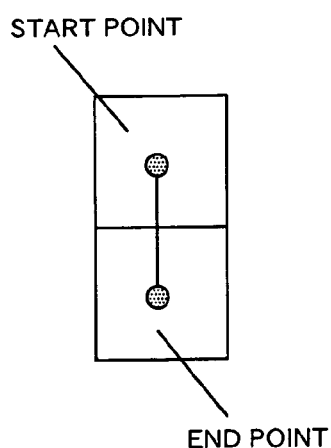
FIG. 13 shows the outline of the straight-line fitting process.
Figure 13B:
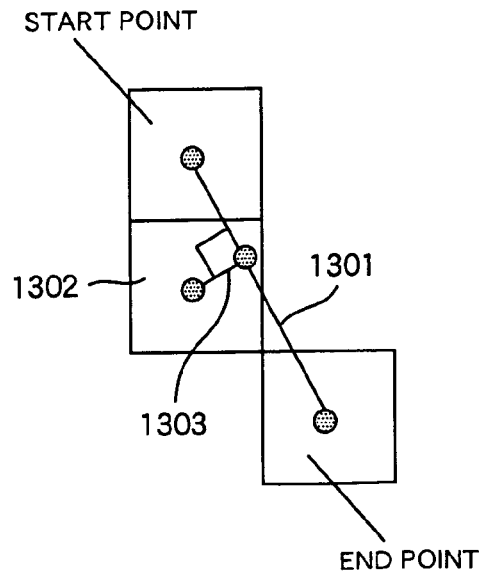

The straight-line fitting 1203 process is to fit the straight line by using relationships between pixels that make up a thinned image 1205 and then convert the thinned image 1205 into vector data 108 that is made up of straight line information. For example, if a pattern shown in FIG. 13 is obtained by the thinning process 1202, a pattern is referred to from the start point. When two pixels are connected as shown in FIG. 13(*a*), the start point and the end point of vector data become coordinate information about two pixels. Furthermore, when three or more pixels are connected as shown in FIG. 13(*b*), first a formula is obtained for the straight line 1301 that connects the start point and the end point, and then the distance 1303 to the pixel 1302 that exists between the start point and the end point is obtained. If the distance 1302 between the straight line 1301 that connects the start point and the end point and the pixel 1302 that exists between the start point and the end point is in the allowable range, that pixel is determined to be located on the straight line and the coordinate values of the start point and the end point are outputted. If the distance 1302 between the straight line that connects the start point and the end point and the pixel that exists between the start point and the end point is not in the allowable range, the pixel is determined not to be located on the straight line, and then the straight-line fitting operation is conducted again with that pixel as a start point. Thus, the straight-line fitting process of the pattern can be conducted.

When conducting the straight-line fitting process, it is possible to provide flexibility for the pattern matching function by executing the following controls:

(1) Control of the Number of Combined Pixels

By setting the Minimum Number of Combined Pixels of a connecting pattern to be vectorized, for example, by performing a control so that the connecting edge of 3 pixels or less is regarded as noise and is not vectorized, it is possible to reduce the number of vector data from the vectorization section 102. With respect to the matching process, which will be described later in this document, the time required for the matching operation tends to increase as the number of vector data increases. Therefore, by reducing the number of vector data, the time required for the matching process can be reduced.

(2) Control of the Distance Between the Straight Line that Connects the Start Point and the End Point and the Pixel that Exists Between the Start Point and the End Point When the distance between the straight line that connects the start point and the end point of the pattern and the pixel that exists between the start point and the end point is set in an allowable range, reducing the allowable range makes it possible to increase the pattern detecting accuracy, and increasing the allowable range makes it possible to decrease the pattern detecting accuracy and to reduce the number of vector data thereby shortening the time for the matching process.

(3) Control of the Angle of the Straight Line that Connects the Start Point and the End Point When an angle of the straight line that connects the start point and the end point of the pattern to be vectorized is set, for example, it is possible to make the setting so that vectorization is not conducted when the formula results in a 45 degree inclination of the straight line created, thereby conducting the vectorization process according to the pattern shape.

Figure 14:
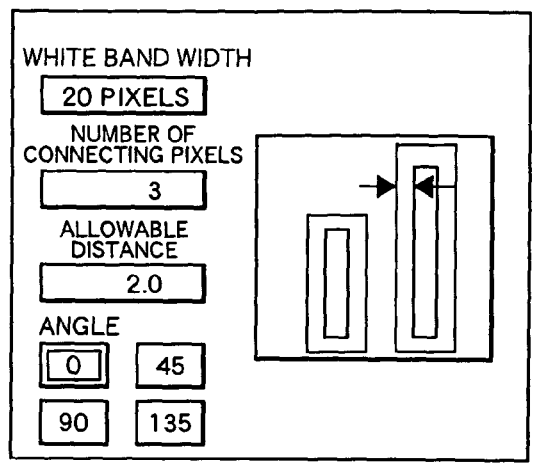
FIG. 14 shows the input screen for inputting image processing parameters used for the pattern matching process according to the present invention.

Setting the above parameters is made possible by providing the control computer 204 with a program that displays the screen as shown in FIG. 14 on the display unit 203 and allows an operator of the scanning electron microscope system 200 to input the above-mentioned parameters 1, 2 and 3 from the input means 205. In an example shown in FIG. 14, parameters inputted by an operator are as follows: "20 pixels" for the white band width, "3" for the number of combined pixels, "2.0" for an allowable distance, and "0 degrees" for an angle.

The control computer 204 stores the inputted parameters 1, 2 and 3 in the memory of the control computer 204, and then registers the parameters in the memory of the image processing unit 202, thereby making it possible to conduct the above-mentioned vectorization operation of the parameters 1, 2 and 3.

The vectorization section 102 can comprise the following hardware: a comparator which detects a brightness value, which is the start point of a pattern, from the pattern image 107; a counter for sequentially counting the number of pixels of the start point of the detected pattern; a memory for storing the counter value in the coordinate position of the pattern of the pattern image; and a comparator which refers to the memory when the pattern is detected and adds the counter value of the previously detected pattern if the previously detected pattern exists around the coordinate position of the pattern. Approximation of the pattern coordinate in the memory is executed by software operated by the CPU. The CPU executes the previously mentioned straight-line fitting of the pattern, which has the same counter value stored in the memory, and stores the result in the memory. When the straight-line fitting of all patterns has been finished, the vectorization process is completed. Moreover, the control of the vectorization process that uses the above-mentioned parameters 1, 2 and 3 can be conducted by comparing the resulting value with the setting value in each portion of the vectorization section and changing the processing result.

The matching section 103 matches the CAD data 106 with the vectorized vector data (hereafter, referred to as pattern vector data) 108 and outputs the matching value 109. The CAD data 106 and the pattern vector data 108 are sent to the matching section 103 as coordinate information about the start point and the end point of the straight line. The matching section calculates the line position and angle information based on the information about the start point and the end point of the pattern vector data 108. The line position and angle information are calculated for each piece of line information contained in the pattern vector data 108.

Next, in the same manner as the above, the line position and angle information about the CAD data 106 are calculated based on the information about the start point and the end point of the CAD data 106. The straight line position and angle information are calculated for each piece of line information contained in the CAD data 106.

Next, a matching value is added when a line is located in the same position and angle of the pattern vector data 108 in the CAD data 106. When there is no matching line, the matching value is not added. When all of the lines contained in the pattern vector data 108 have been compared with all of the lines contained in the CAD data 106, the matching process is completed. The final matching value 109 obtained when the matching process has been completed shows the degree of matching of the pattern that is contained in both the CAD data 106 and the SEM image 105.

Furthermore, as shown in FIG. 4, when conducting the pattern matching process to detect the coordinate position from the SEM image 105 that matches the CAD data 106, a line in the pattern vector data 108 located in the area of the same size as the CAD data 106 is extracted by using the line's coordinate information, and then the degree of matching of the line of the pattern vector data 108 within the area with the CAD data 106 is obtained. The above procedures are conducted for each area of the pattern vector data 108, and then the degree of matching of each area is registered as the central coordinate of each area. After all of the areas of the pattern vector data 108 have been matched, the coordinate position that has the highest matching value in the pattern vector data 108 is outputted as a coordinate position that matches the CAD data 106.

The matching section 103 is configured such that a coordinate position and an angle for each line are obtained by using a general formula based on the information about the start point and the end point of the line contained in the CAD data 106 stored in the memory and the information about the start point and the end point of the line contained in the pattern vector data 108, and when there is a line, in the CAD data 106, which is located at the same coordinate position at the same angle as a line contained in the pattern vector data 108, a matching value is added by software executed by the CPU. Furthermore, when detecting the coordinate position from a SEM image 105 that matches the CAD data 106 or when detecting a coordinate position from the CAD data 106 that matches the SEM image 105, it is sufficient to add a function, to the previously-mentioned matching software, which obtains the matching value for each coordinate position in the data to be detected, obtains the maximum matching value from among the calculated matching value of each of the coordinate positions, and then outputs the coordinate position having the maximum matching value. In addition to the matching operation that uses a line as stated above, a variety of other techniques are proposed such as generalization Hough-Fourier transformation, and such a technique can be used.

As stated above, a pattern matching apparatus 100 according to the present invention can be included in the image processing unit 202 of the scanning electron microscope system 200. And, it can extract a pattern included in a SEM image 105 with high accuracy by using image processing parameters, such as for the white band width and the straight-line fitting operation, accurately obtain the degree of pattern matching of the CAD data 106 with a pattern created on a semiconductor device by vectorizing the pattern and matching the pattern with the CAD data 106, accurately detect the position from the CAD data 106 that matches the SEM image 105 so as to identify the inspection position, and also accurately detect the area from the SEM image 105 that matches the CAD data 106.

Embodiment 2

Figure 15:
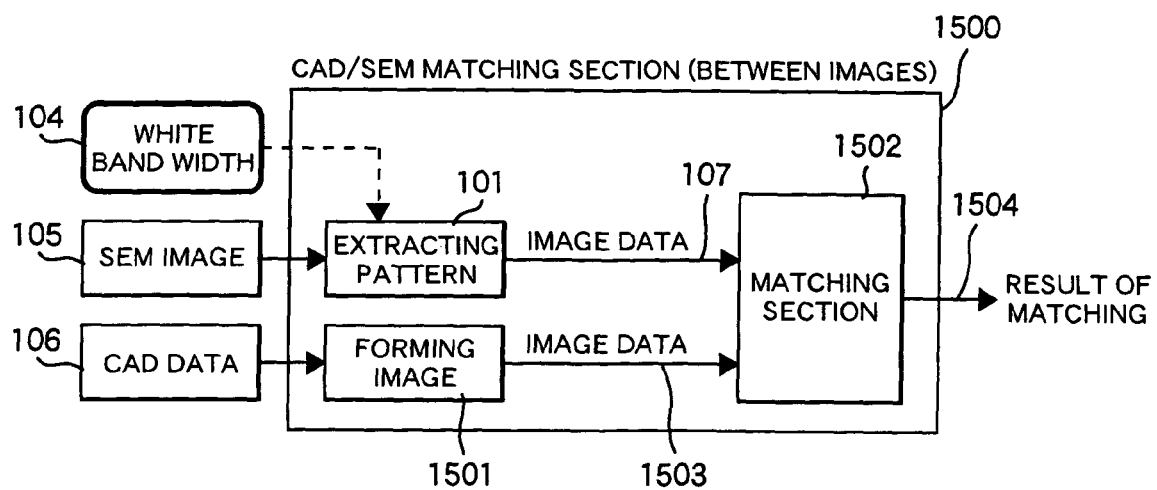
FIG. 15 is a block diagram that shows a pattern matching apparatus of embodiment 2 according to the present invention.

Furthermore, the objective of the pattern matching apparatus according to the present invention can be achieved by the configuration in which line information on the CAD data 106 is converted into an image as shown in FIG. 15 and then the images are matched.

A pattern matching apparatus 1500 according to the present invention comprises a pattern extracting section 101 which extracts a pattern image 107 from the SEM image 105 by using information 104 about the white band width; an image forming section 150 which creates image data 1503 from the CAD data 106; and a matching section 1502 which conducts the pattern matching of a pattern image 107 extracted from the SEM image 105 with image data 1503 of the CAD data 106, and outputs the result of the matching process 1504. In the same manner as in embodiment 1, the pattern matching apparatus 1500 can be included in an image processing unit 202 of a scanning electron microscope system 200. Moreover, the pattern matching apparatus 1500 according to the present invention comprises a memory for storing CAD data 106, a SEM image 105, image processing parameters and image processing programs; a CPU which controls the image processing function and executes image processing programs; and hardware, such as ASIC, FPGA, for quickly executing the image processing operation.

Components other than the image forming section 1501 and the matching section 1502 are the same as those of the pattern matching apparatus 100 of embodiment 1, and therefore, descriptions are omitted.

The image forming section 1501 creates image data 1503 based on the CAD data 106 stored in the memory. The image forming section 1501 creates a straight line formula which connects the start point and the end point by using a general equation based on the coordinate information about the start point and the end point of the line of the CAD data 106, draws a straight line that connects the coordinates of the start point and the end point on the image??? and stores it in the memory. The image forming section 1501 executes the above-mentioned function by software operated by the CPU.

The matching section 1502 conducts the pattern matching of a pattern image 107 extracted from a SEM image 105 with image data 1503 of the CAD data, and creates the result of the matching process 1504. Generally, the normalization correlation method or the brightness difference method is used for matching images, but the image matching technique is not intended to be limited to that method.

When the brightness difference method is applied, hardware configuration includes a subtract for obtaining a difference between a brightness value of each of the pixels that make up the CAD image data 1503 and a brightness value of each of the pixels that make up a pattern image 107; an adder and a memory for adding a subtraction result and stores it; a table memory for converting the value so that the brightness value increases as the value of the memory decreases when differences of the brightness of all the pixels that make up an image have been calculated; and a table lookup device for referring to a table memory from the value of the memory and outputs the result of the matching process 1504.

As stated above, a pattern matching apparatus 100 according to the present invention can be included in the image processing unit 202 of the scanning electron microscope system 200. And, it can extract a pattern included in a SEM image 105 with high accuracy by using image processing parameters, such as for the white band width and the straight-line fitting, accurately obtain a degree of pattern matching of the CAD data 106 with a pattern created on a semiconductor device by matching the pattern with an image data 1503 created from CAD data, accurately detect the position from the CAD data 106 that matches the SEM image 105 so as to identify the inspection position, and also accurately detect the area from the SEM image 105 that matches the CAD data 106.

Embodiment 3

Figure 16:
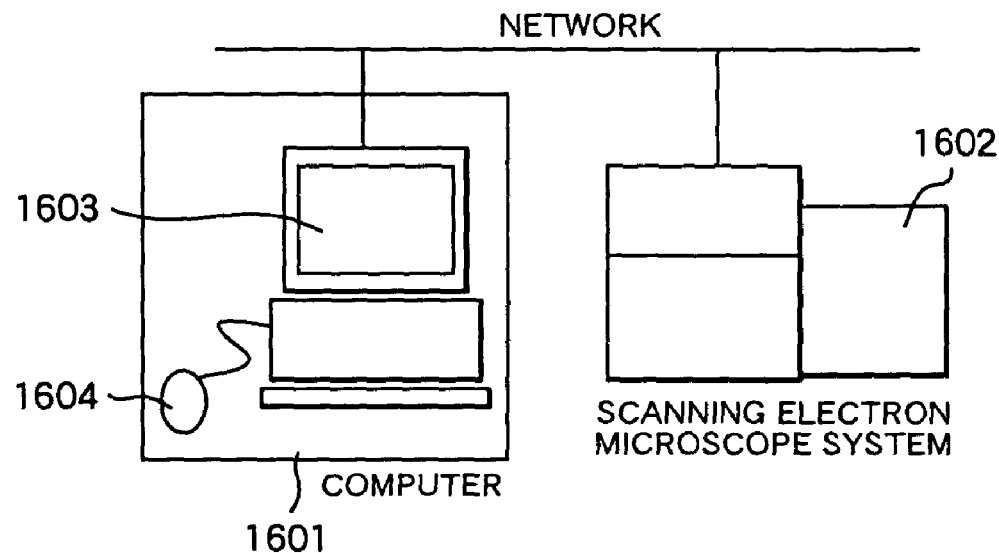
FIG. 16 shows a computer having a pattern matching function of embodiment 3 according to the present invention.

Furthermore, a pattern matching apparatus according to the present invention can be included in an independent environment which is different from a scanning electron microscope system as shown in embodiments 1 and 2. That is, it can be installed in a computer 1601 into which an image photographed by a SEM 201 shown in FIG. 16 is inputted via a local area network or by means of an externally connected memory. The computer 1601 is an information processing unit typified by a personal computer or a workstation. It comprises a signal input/output IF for inputting data into and outputting data from a scanning electron microscope system 1602 and other computers via a network or an externally connected memory; a memory for storing an SEM image, CAD data, programs for conducting pattern matching, and the results of the matching process; a CPU for executing the programs and creating the results of the matching process: a display unit 1603 for displaying screens for setting parameters, such as a SEM image and the white band width, to conduct the matching process; and an input means 1604 for inputting the parameters.

Figure 17:
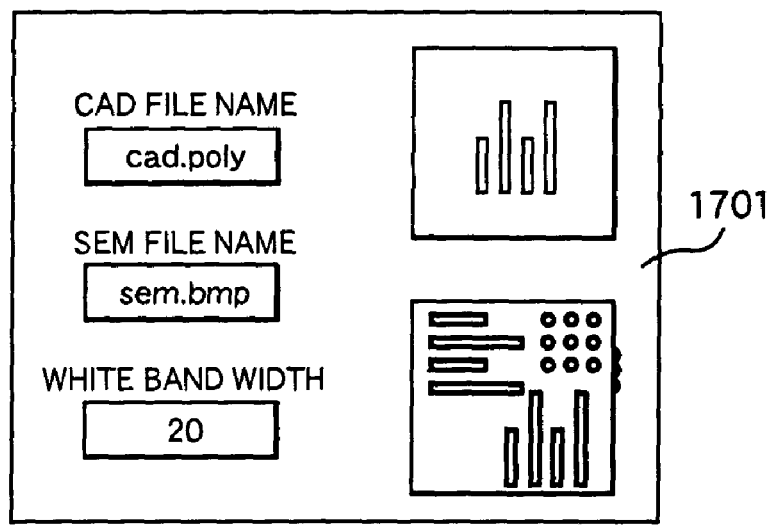
FIG. 17 shows the screen on which image processing parameters for executing the pattern matching function of embodiment 3 according to the present invention are inputted.

FIG. 17 shows an input screen 1701 for inputting various parameters to conduct the pattern matching process according to the present invention. Specifically, the screen is for inputting a name of the file that contains a SEM image that is a pattern matching target and white band width information used for the edge detection. In addition, it is possible to display the screen shown in FIG. 14 and input vectorization parameters thereby conducting the pattern matching process in accordance with the inspection purposes. The computer 1601 displays a SEM image and CAD data on the screen in response to the information inputted, and sets parameters for the image processing program. Furthermore, an operator of a computer 1601 can specify the range for the pattern matching operation within the CAD data as well as the range for the pattern matching operation within the SEM image. After the pattern matching has been executed, the result of the matching process is stored in the memory, displayed on the display unit 1603, or transferred to another unit via a network or an externally-connected memory.

Figure 18:
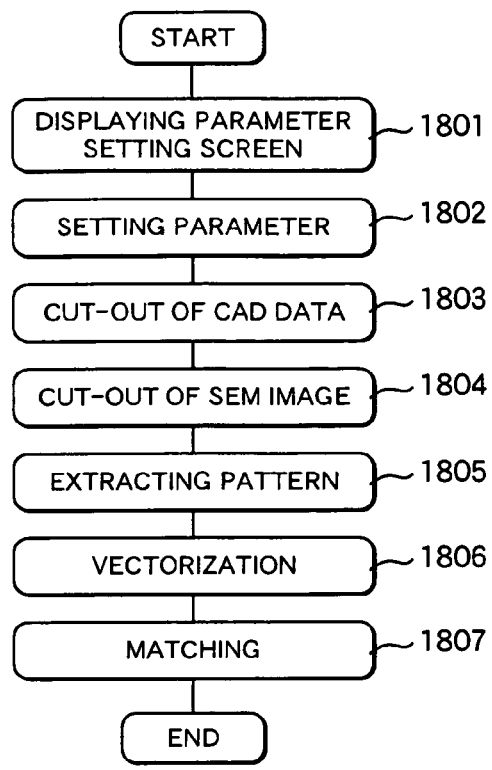
FIG. 18 is a flow chart that shows the pattern matching function of embodiment 3 according to the present invention.

FIG. 18 shows a flow chart for conducting the pattern matching process according to the present invention by software operated by the CPU of the computer 1601. After a pattern matching program has been activated, the parameter setting screen is displayed on the display unit 1603 (step 1801). Various image processing parameters, SEM image, and CAD data file information that have been inputted by an operator are registered in the memory (step 1802). When an operator has specified the pattern matching range in the CAD data and the SEM image, the area in which pattern matching operation is conducted is determined according to the range information, and is registered in the memory (steps 1803 and 1804). The pattern extraction is conducted by using white band width information contained in the SEM image file located in the memory (step 1805). During the pattern extracting process, the filtering operation is executed. If a plurality of directions along which the white band is extracted has been specified when the parameter was set (step 1802), the filtering operation is conducted by using matrices along the specified directions, and the filtering result of each direction is stored in the memory. Among the filtering results of all the directions, the filtering result which has the highest value is obtained and outputted into the memory. After a pattern has been detected, vectorization is conducted (step 1806). During the vectorization process, a pattern image in the memory is binarized by using a threshold value and the binarization result is stored in the memory. After the binarization has been finished, the thinning operation of the binary image in the memory is conducted. The area that matches a plurality of matrices that show the boundary between the white band and the background is searched for from the binary image, and the matching portion is replaced with a background image. With respect to a portion that does not match, the brightness value of the original binary image remains unchanged. When all of the white bands are converted into a one-pixel wide central line, the thinning operation is completed, and the thinned pattern image is stored in the memory. After the thinning operation has been finished, the coordinate position of the pattern connected from the thinned image in the memory is detected, and information about each connecting pattern is stored in the memory. After the connecting pattern has been detected, the straight line formula that connects the start point and the end point of the pattern that make up the connecting pattern is obtained, the approximation of pattern pixels located between the start point and the end point is conducted, and coordinate values of the start point and the end point of the connecting pattern are outputted into the memory. After the start point and the end point of all of the connecting patterns have been detected, the vectorization operation is completed. After the vectorization operation has been finished, the position of the line and the inclination are obtained from the vector data extracted from a SEM image in the memory and from the CAD data in the memory, and then the matching operation is conducted (step 1807). After all of the line information has been matched, the pattern matching process is finished. Furthermore, vectorization, as shown in embodiment 2, is not executed for the pattern extracted from the SEM image, and the CAD data is converted into an image. When pattern matching is conducted between pattern images extracted from the CAD data image and the SEM image, the vectorization function 1806 can be replaced with an image forming function in which the CAD data's line information is converted into straight line information, and the straight line is drawn as an image, and the matching operation (step 1807) can be replaced with a matching function, such as the normalization correlation method or the brightness difference method, that detects the degree of matching between brightness of pixels that make up an image.

As stated above, a pattern matching apparatus according to the present invention can be included as a software program into a computer 1601 into which the CAD data and the SEM image can be inputted via a local area network or an externally-installed memory. And, it can extract a pattern included in a SEM image with high accuracy by using image processing parameters, such as for the white band width and the straight-line fitting, accurately obtain the degree of pattern matching of the CAD data 106 with a pattern created on a semiconductor device by matching the pattern with the CAD data, accurately detect the position from the CAD data 106 that matches the SEM image 105 so as to identify the inspection position, and also accurately detect the area from the SEM image 105 that matches the CAD data 106.

Moreover, the above-mentioned embodiment uses a SEM to acquire an image created on the semiconductor device. However, a device other than the SEM can be used. For example, the use of a device that uses an optical photographing means to acquire an image created on the semiconductor device can achieve the same effects.

What is claimed is:
1. A pattern matching apparatus comprising:
a memory unit for storing image data of a semiconductor device and design data of said semiconductor device,
an information input unit for inputting information relating to brightness distribution of a white band having a convex-shape,
a pattern extracting unit for extracting a thinned line of a pattern on the semiconductor device from said image data by detecting correspondence between the inputted brightness distribution information and the image data and by detecting peak position information of brightness distribution on the image data, with the input information, wherein the peak position information of the brightness distribution is detected by using information on inclination between brightness value of the white band at the peak position and brightness value of inclined section that exists on both sides of the peak, wherein the thinned line is obtained by detecting a central line of the white band, and a matching unit for matching the thinned line of the pattern with the design data.

2. A pattern matching apparatus comprising:

a memory unit for storing image data of a semiconductor device and design data of said semiconductor device, an information input unit for inputting information relating to brightness distribution of a white band having a convex-shape, a pattern extracting unit for extracting a thinned line of a pattern created on the semiconductor device from said image data by detecting correspondence between the inputted brightness distribution information and the image data and by detecting peak position information of brightness distribution on the image data, with the input information, wherein the peak position information of the brightness distribution is detected by using information on inclination between brightness value of the white band at the peak position and brightness value of inclined section that exists on both sides of the peak, wherein the thinned line is obtained by detecting a central line of the white band, a vectorization unit for converting the thinned line of the pattern into vector data, and a matching unit for matching the thinned line of the pattern with the design data.

3. The pattern matching apparatus according to claim 1, wherein said information relating to brightness distribution of the white band is a pixel width of the white band.

4. The pattern matching apparatus according to claim 1, wherein said information relating to brightness distribution of the white band is a relative value when it is compared with a white band that is a reference.

5. The pattern matching apparatus according to claim 1, wherein the shape of the thinned line of the pattern extracted from the image data changes by changing said information.

6. The pattern matching apparatus according to claim 1, wherein said information input unit includes a unit for inputting information about a direction of the thinned line of the pattern detected on the semiconductor device.

7. The pattern matching apparatus according to claim 1, wherein said pattern extracting unit includes a function to adjust the result of filtering to extract the thinned line of the pattern according to the information about a direction of the thinned line of the pattern.

8. The pattern matching apparatus according to claim 2, wherein said information relating to brightness distribution of the white band is a pixel width of the white band.

9. The pattern matching apparatus according to claim 2, wherein said information relating to brightness distribution of the white band is a relative value when it is compared with a white band that is a reference.

10. The pattern matching apparatus according to claim 2, wherein the shape of the thinned line of the pattern extracted from the image data changes by changing said information.

11. The pattern matching apparatus according to claim 2, wherein said information input unit includes a unit for inputting information about a direction of the thinned line of the pattern detected on the semiconductor device.

12. The pattern matching apparatus according to claim 2, wherein said pattern extracting unit includes a function to adjust the result of filtering to extract the thinned line of the pattern according to the information about a direction of the thinned line of the pattern.

13. The pattern matching apparatus according to claim 2, wherein an image of said semiconductor device photographed by an electron microscope is used as said image data, and said information input unit includes a unit for inputting information about the number of combined pixels to determine whether to vectorize the pixels or not for a parameter for converting the thinned line of the pattern extracted from the image data photographed by the electron microscope into vector data.

14. The pattern matching apparatus according to claim 2, wherein said vectorization unit uses information about the number of combined pixels that are to be vectorized or not to be vectorized in order to select pixels to be vectorized and execute a vectorization process.

15. The pattern matching apparatus according to claim 2, wherein an image of said semiconductor device photographed by an electron microscope is used as said image data, and said information input unit includes a unit for inputting information about the distance between a straight line that is created by combined pixels of a pattern and a pixel that exists between the combined pixels to set a parameter for converting the thinned line of the pattern extracted from the image data photographed by the electron microscope into vector data.

16. The pattern matching apparatus according to claim 2, wherein said vectorization unit uses information about the distance between a straight line created by combined pixels of the thinned line of the pattern and a pixel that exists between the combined pixels in order to approximate the thinned line of the pattern to the straight line information thereby executing a vectorization process.

17. The pattern matching apparatus according to claim 2, wherein an image of said semiconductor device photographed by an electron microscope is used as said image data, and said information input unit includes a unit for inputting information about an angle of a straight line created by combined pixels of the thinned line of the pattern to set a parameter for converting the thinned line of the pattern extracted from the image data photographed by the electron microscope into vector data.

18. The pattern matching apparatus according to claim 2, wherein said vectorization unit uses information about an angle of a straight line created by combined pixels of the thinned line of the pattern in order to select the thinned line of the pattern to be outputted as vector data and output it.

19. A scanning electron microscope system comprising:
an image processing unit that includes a pattern matching apparatus according to claim 1,
a control computer for controlling a scanning electron microscope and the image processing unit,
an input unit for inputting parameters for operating the scanning electron microscope and executing a pattern matching operation, and
a display unit for displaying image data sent from the scanning electron microscope and a result of the pattern matching operation.

20. An image data forming apparatus comprising:
an information input unit for inputting information relating to brightness distribution of a white band having a convex-shape; and an image processing unit for extracting a thinned line of a pattern on a semiconductor device from image data by detecting correspondence between the inputted brightness distribution information and the image data and by detecting peak position information of brightness distribution on the image data with the input information wherein the peak position information of the brightness distribution is detected by using information on inclination between brightness value of the white band at the peak position and brightness value of inclined section that exists on both sides of the peak, and wherein the thinned line is obtained by detecting a central line of the white band.

21. The image data forming apparatus according to claim 20, wherein the image processing unit conducts the detecting of the peak position using different brightness distribution information corresponding to information on the white band.

22. The image data forming apparatus according to claim 20, wherein:

the brightness distribution information is brightness information on plural pixels arranged in a matrix form, and the image processing unit detects the peak position using a piece of information having a size close to the size of the white band, selected from pieces of the brightness information with different sizes.

23. The image data forming apparatus according to claim 20, wherein the image processing unit produces vector data by vectorizing an image representing a pattern of the thinned line.

24. The image data forming apparatus according to claim 20, wherein the image processing unit makes binary an image for which the peak position is detected and makes the center of binary brightness information into the thinned line.

25. The image data forming apparatus according to claim 20, wherein the image processing unit carries out pattern matching between a pattern of the thinned line and design data of the pattern.

* * * * *